(12) United States Patent
Hsiung et al.

(10) Patent No.: US 9,202,579 B2
(45) Date of Patent: Dec. 1, 2015

(54) COMPENSATION FOR TEMPERATURE DEPENDENCE OF BIT LINE RESISTANCE

(71) Applicant: SanDisk Technologies Inc., Plano, TX (US)

(72) Inventors: Chia-Lin Hsiung, Fremont, CA (US); Mohan Dunga, Santa Clara, CA (US); Man L Mui, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 209 days.

(21) Appl. No.: 13/828,361

(22) Filed: Mar. 14, 2013

(65) Prior Publication Data
US 2014/0269070 A1   Sep. 18, 2014

(51) Int. Cl.
| G11C 11/56 | (2006.01) |
| G11C 16/04 | (2006.01) |
| G11C 7/04 | (2006.01) |
| G11C 7/12 | (2006.01) |
| G11C 7/02 | (2006.01) |
| G11C 11/4094 | (2006.01) |
| G11C 16/26 | (2006.01) |

(52) U.S. Cl.
CPC *G11C 16/26* (2013.01); *G11C 7/04* (2013.01); *G11C 11/5642* (2013.01); *G11C 16/0483* (2013.01)

(58) Field of Classification Search
CPC .. G11C 16/0483; G11C 11/5642; G11C 7/12; G11C 11/4094; G11C 7/04; G11C 7/02

USPC ............ 365/185.11, 185.18, 185.21, 189.06, 365/206, 211
See application file for complete search history.

(56) References Cited

U.S. PATENT DOCUMENTS

| 5,798,966 | A   * | 8/1998  | Keeney ..................... 365/185.18 |
| 6,870,766 | B2   | 3/2005  | Cho et al. |
| 7,113,432 | B2  * | 9/2006  | Mokhlesi ............... G11C 16/06 365/185.11 |
| 7,383,149 | B1  * | 6/2008  | Walker ......................... 702/130 |
| 7,411,830 | B2  * | 8/2008  | Takeuchi et al. ......... 365/185.18 |
| 7,460,407 | B2   | 12/2008 | Mokhlesi et al. |
| 7,480,588 | B1  * | 1/2009  | Walker ......................... 702/132 |
| 7,551,477 | B2   | 6/2009  | Mokhlesi et al. |
| 7,911,864 | B2   | 3/2011  | Itoh |
| 7,974,134 | B2   | 7/2011  | Zhang et al. |

(Continued)

OTHER PUBLICATIONS

International Search Report & The Written Opinion of the International Searching Authority dated Jul. 4, 2014, International Application No. PCT/US2014/019738.

*Primary Examiner* — Hoai V Ho
*Assistant Examiner* — Roberto Mancera
(74) *Attorney, Agent, or Firm* — Vierra Magen Marcus LLP

(57) ABSTRACT

Techniques for sensing the threshold voltage of a memory cell during reading and verify operations by compensating for changes, including temperature-based changes, in the resistance of a bit line or other control line. A memory cell being sensed is in a block in a memory array and the block is in a group of blocks. A portion of the bit line extends between the group of blocks and a sense component and has a resistance which is based on the length/distance and the temperature. Various parameters can be varied with temperature and the group of blocks to provide the compensation, including bit line voltage, selected word line voltage, source line voltage, sense time and/or sense current or voltage.

8 Claims, 12 Drawing Sheets

(56) References Cited

U.S. PATENT DOCUMENTS

| | | |
|---|---|---|
| 7,986,579 B2 | 7/2011 | Akaogi |
| 8,143,653 B2 * | 3/2012 | Cho ..................... G11C 11/56 257/260 |
| 8,208,333 B2 | 6/2012 | Itoh |
| 8,228,739 B2 | 7/2012 | Pan et al. |
| 2003/0189856 A1 | 10/2003 | Cho et al. |
| 2005/0036369 A1 | 2/2005 | Lee et al. |
| 2006/0158932 A1 * | 7/2006 | Tamada et al. ............. 365/185.2 |
| 2006/0221694 A1 * | 10/2006 | Cernea et al. ............ 365/185.12 |
| 2007/0070710 A1 * | 3/2007 | Takenaka ................. 365/189.01 |
| 2007/0147113 A1 * | 6/2007 | Mokhlesi et al. ........ 365/185.03 |
| 2007/0171744 A1 * | 7/2007 | Mokhlesi et al. ............. 365/203 |
| 2007/0291566 A1 * | 12/2007 | Mokhlesi et al. ............. 365/212 |
| 2008/0247228 A1 | 10/2008 | Nguyen et al. |
| 2008/0247253 A1 | 10/2008 | Nguyen et al. |
| 2009/0097332 A1 * | 4/2009 | Kim et al. ................ 365/189.07 |
| 2009/0161433 A1 * | 6/2009 | Lee et al. ................. 365/185.12 |
| 2010/0027341 A1 * | 2/2010 | Tokiwa et al. ........... 365/185.17 |
| 2010/0074014 A1 * | 3/2010 | Dunga et al. ............. 365/185.17 |
| 2010/0271861 A1 * | 10/2010 | Kitagawa ..................... 365/148 |
| 2012/0081964 A1 * | 4/2012 | Li ........................... 365/185.17 |
| 2012/0134213 A1 * | 5/2012 | Choi ....................... G11C 7/04 365/185.18 |
| 2012/0230103 A1 * | 9/2012 | Choe et al. ................. 365/185.2 |
| 2012/0275235 A1 | 11/2012 | Parker |

* cited by examiner

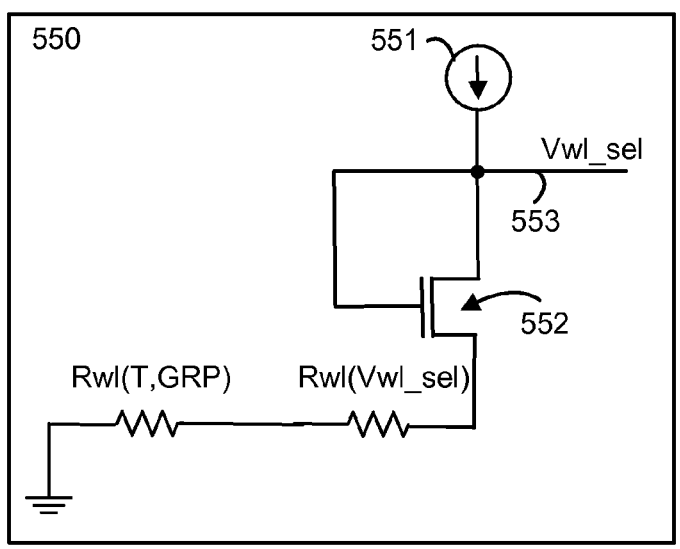
Fig. 5B
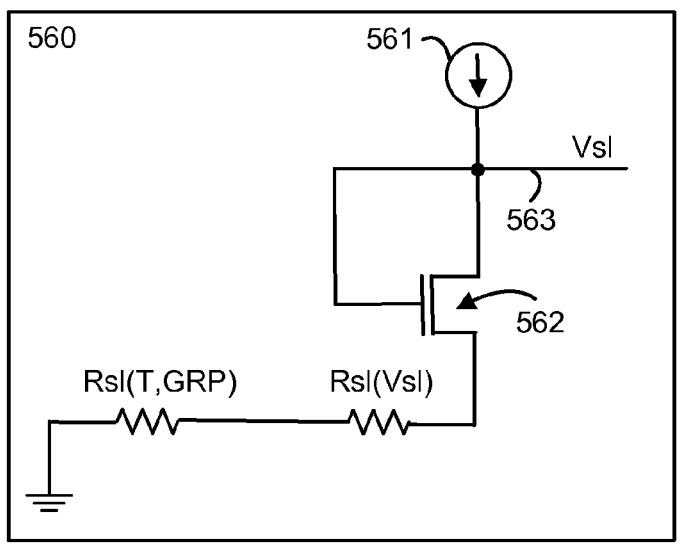
Fig. 5C
Fig. 6A
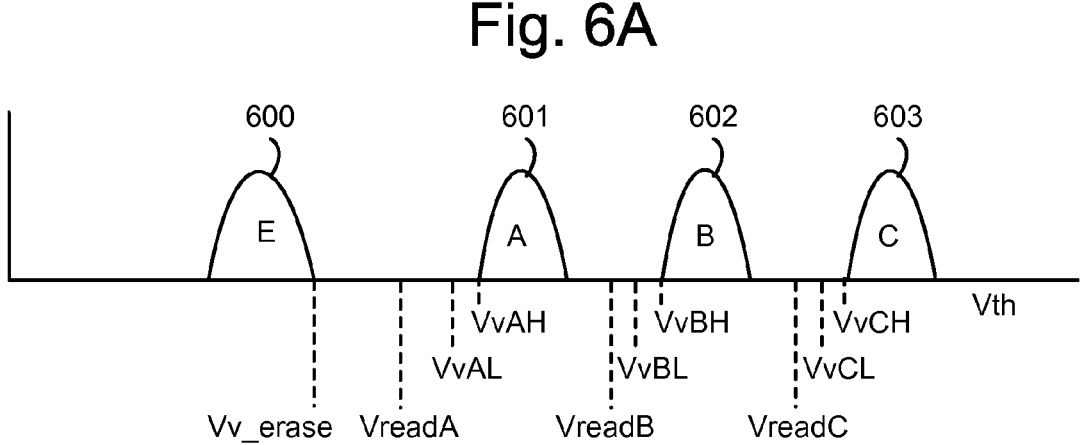

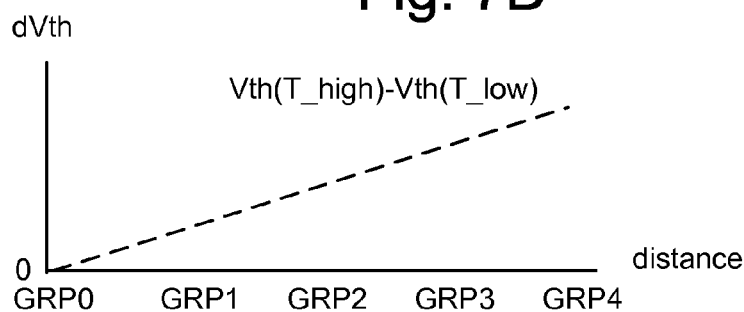
Fig. 7D
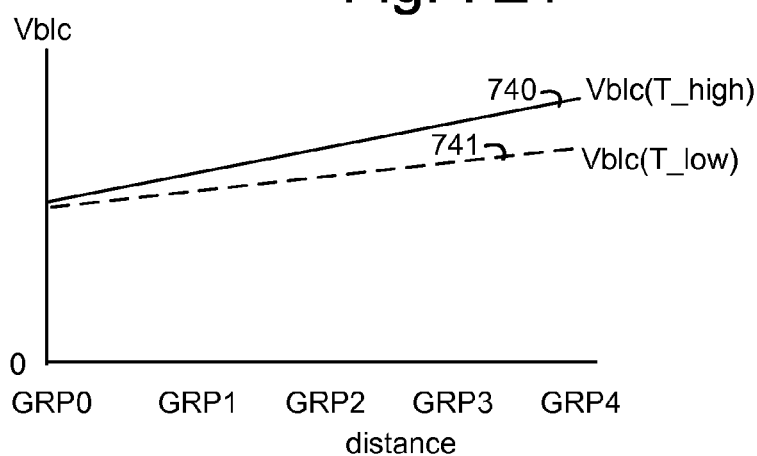
Fig. 7E1
Fig. 7E2
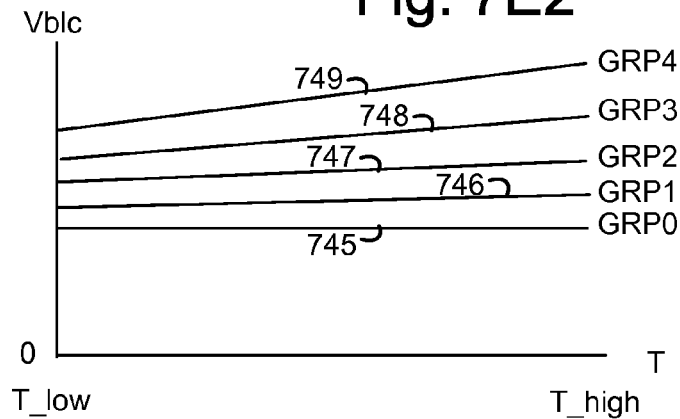
Fig. 7E3
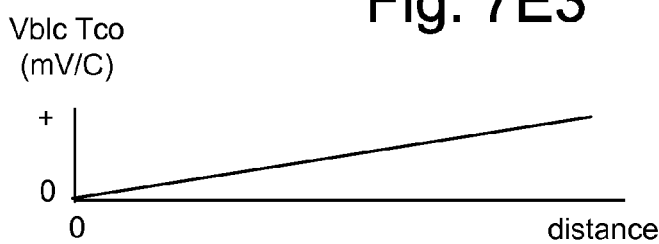

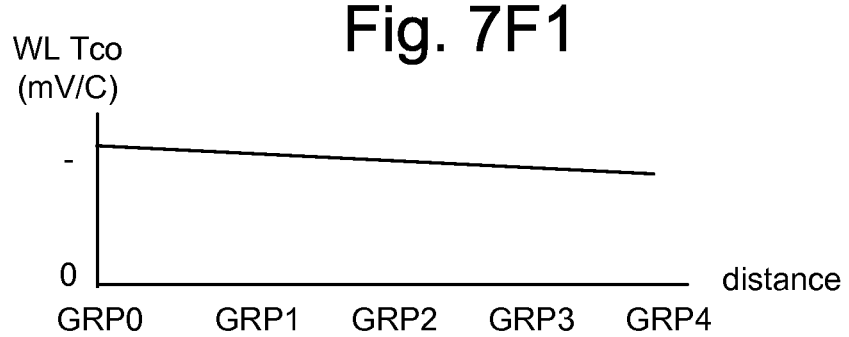
Fig. 7F1
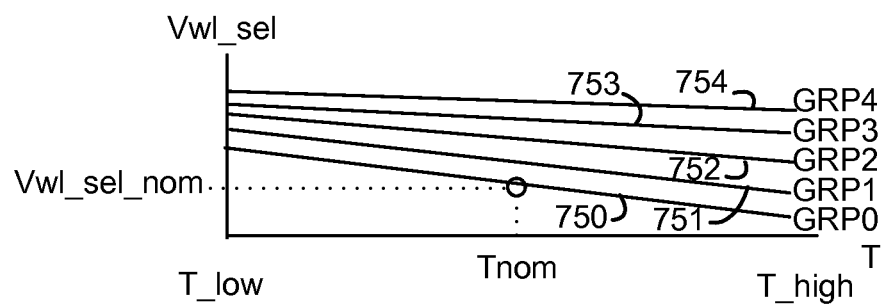
Fig. 7F2
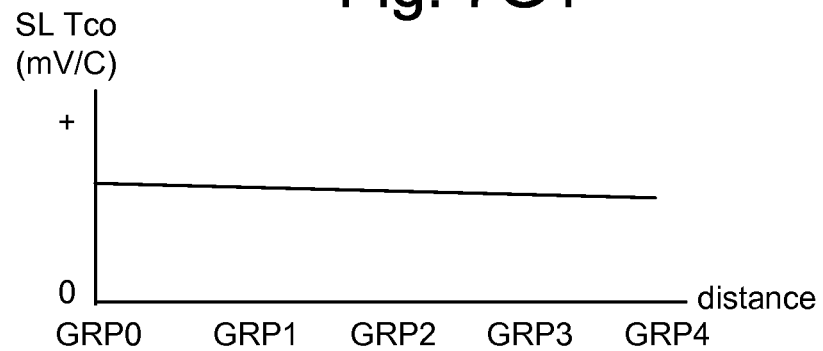
Fig. 7G1

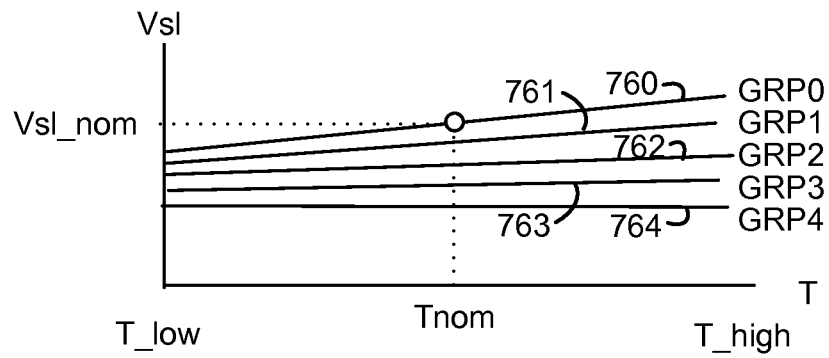
Fig. 7G2
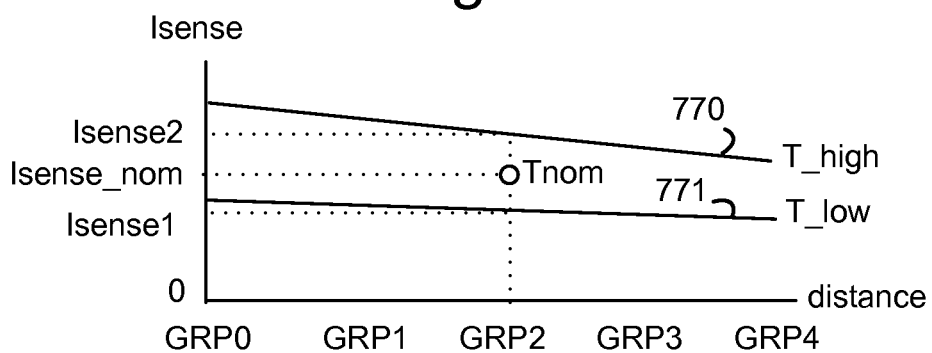
Fig. 7H1
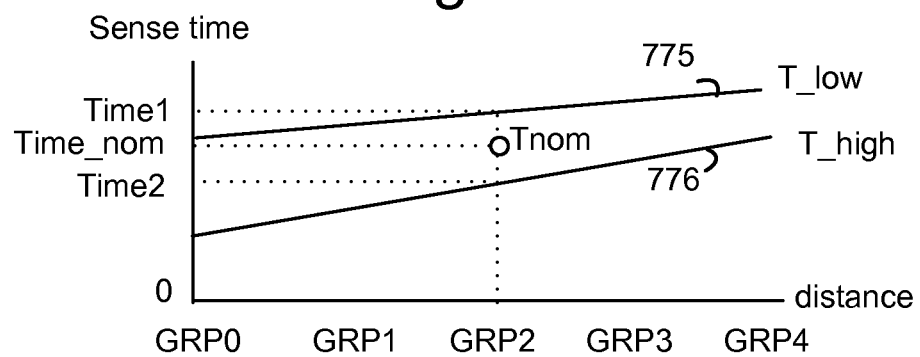
Fig. 7H2

COMPENSATION FOR TEMPERATURE DEPENDENCE OF BIT LINE RESISTANCE

BACKGROUND

The present technology relates to techniques for sensing memory cells in a non-volatile memory device.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Flash memory is among the most popular type of non-volatile semiconductor memories. With flash memory, the contents of an entire memory array can be erased in one step.

Memory devices include 2D and 3D configurations. For example, 2D NAND memory device is one type of flash memory in which a floating gate is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Recently, ultra high density storage devices have been proposed using a 3D NAND stacked memory structure. One example is the Bit Cost Scalable (BiCS) architecture in which the memory device is formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. Other examples of 3D memory devices include Terrabit Cell Array Transistor (TCAT), Vertical Stacked Array Transistor (VSAT) and Vertical-Gate NAND (VG-NAND).

Techniques are desired for accurately sensing the threshold voltage of a memory cell, in particular, as memory devices are scaled down.

BRIEF DESCRIPTION OF THE DRAWINGS

Like-numbered elements refer to common components in the different figures.

FIG. 5B depicts an example circuit which compensates a selected word line voltage Vwl_sel based on temperature and a distance from a sense component to a group of blocks in which a memory cell is sensed.

FIG. 5C depicts an example circuit which compensates a source line voltage Vsl based on temperature and a distance from a sense component to a group of blocks in which a memory cell is sensed.

FIG. 6A depicts example threshold voltage distributions and voltages used for read and verify operations.

FIG. 7D depicts a change in the threshold voltage (Vth) only due to the temperature-dependent BL resistance (excluding the effect of temperature on surface potential) of a memory cell over a temperature range of T_low to T_high, as a function of a distance from a sense component to a memory cell being sensed.

FIG. 7E1 depicts a clamping voltage Vblc in a sense component changing as a function of a distance from the sense component to a memory cell being sensed and as a function of temperature, where Vblc is temperature-compensated and distance-compensated.

FIG. 7E2 depicts changes in Vblc as a function of temperature and the distance between the sense component and different groups of blocks of memory cells.

FIG. 7E3 depicts a Vblc temperature coefficient (Tco) as a function of distance from a sense component to a memory cell being sensed.

FIG. 7F1 depicts a temperature coefficient (Tco) of a word line as a function of a distance from a sense component to a memory cell being sensed, where Tco varies as a function of the distance.

FIG. 7F2 depicts Vwl_sel as a function of temperature and distance from a sense component to a memory cell being sensed, for groups GRP0 to GRP4 of FIG. 7F1.

FIG. 7G1 depicts a temperature coefficient (Tco) of a source line (SL) as a function of a distance from a sense component to a memory cell being sensed.

FIG. 7G2 depicts Vsl as a function of temperature and distance from a sense component to a memory cell being sensed, for distances represented by GRP0 to GRP4, consistent with FIG. 7G1.

FIG. 7H1 depicts a sense current as a function of a distance from a sense component to a memory cell being sensed, and as a function of temperature.

FIG. 7H2 depicts a sense time as a function of a distance from a sense component to a memory cell being sensed, and as a function of temperature.

DETAILED DESCRIPTION

Figure 1:
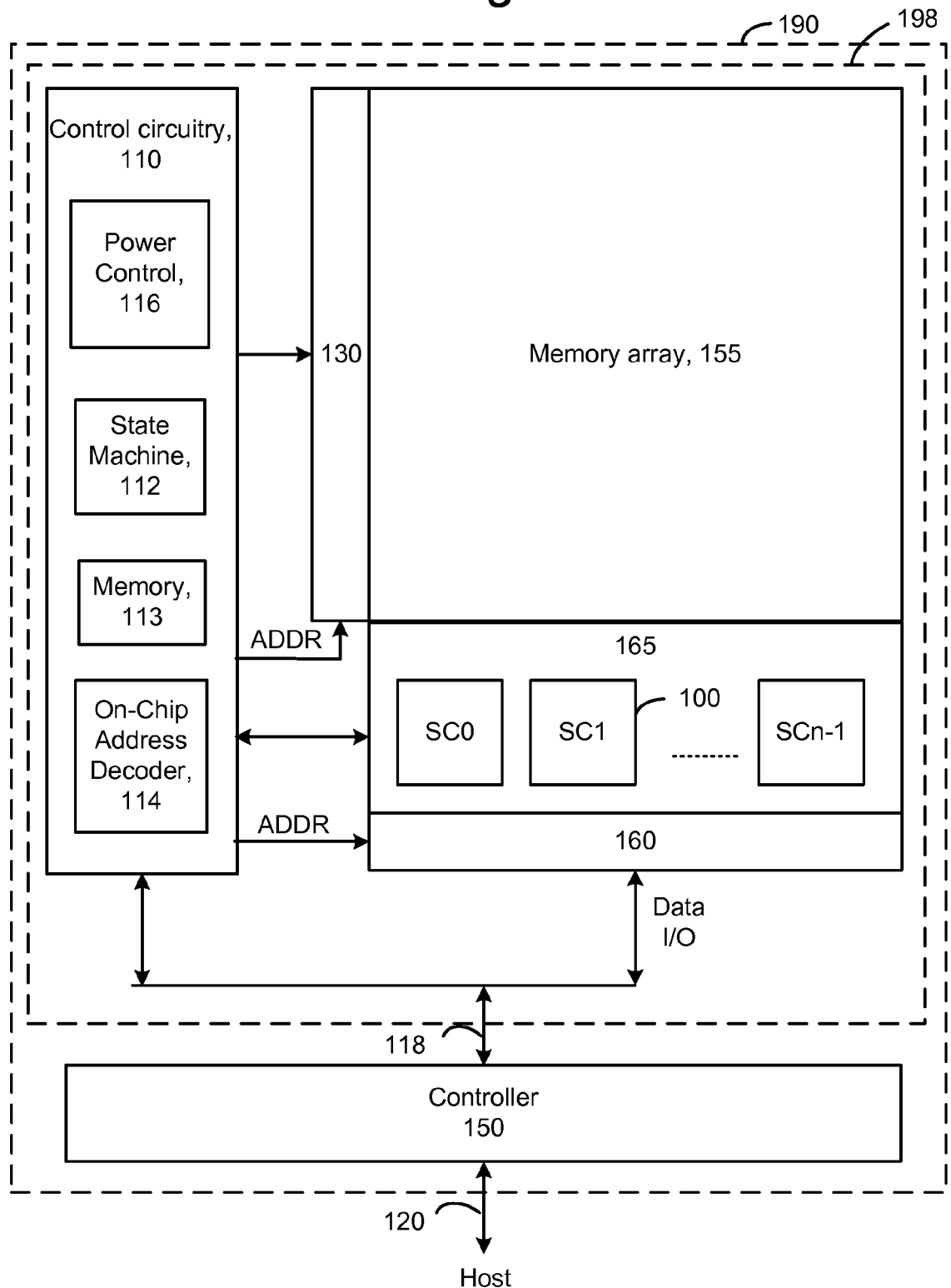
FIG. 1 is a block diagram of a non-volatile memory system using single row/column decoders and read/write circuits.

Techniques are provided for accurately sensing the threshold voltage of a memory cell during reading and verify operations by compensating for changes, including temperature-based changes, in the resistance of a bit line or other control line. The techniques are applicable to 2D and 3D configurations of memory devices.

During a sensing operation, the threshold voltage of a memory cell is determined. Typically, a voltage is applied to the drain of the memory cell via a bit line while a sensing component determines whether a sense current through the memory cell exceeds a reference level (Isense), e.g., whether or not the memory cell is in a conductive state. In one approach, a bit line clamping (BLC) transistor is used to apply the voltage (Vblc) to the bit line. However, due to a resistance of the bit line (Rbl), the voltage at the drain of the memory cell becomes increasingly lower further from the BLC transistor.

One approach to resolve this is to adjust Vblc based on a distance of the bit line between the sense component and the memory cell, e.g., a block of cells in which the sensed memory cell is located. Further, to simplify the implementation by reducing the number of Vblc levels, a common adjustment can be used for groups of adjacent blocks. In this approach, the Vblc is relatively higher for blocks which are relatively further from the sense component to compensate for the relatively higher resistance.

Moreover, with the continuous scaling down of the line width of the bit line, the bit line resistance becomes higher. Further, drain induced barrier lowering (DIBL) increases as word line dimensions become smaller. As Vd drops for a memory cell which is further from a sense component, the Vth increases due to the DIBL effect. With these conditions, it has been found that temperature variations are significant during sensing operations.

Techniques provided herein address the temperature dependence of the voltage drop along a bit line to avoid inaccuracies in a sensing operation. A first solution is to set Vblc as a function of temperature and of the distance or length of the bit line between the sense component and a block or groups of blocks of memory cells being sensed. A second solution is to set the word line voltage as a function of temperature and distance so that it has a temperature coefficient (Tco) which is a function of a block or groups of blocks of memory cells being sensed. A third solution is to set the source line voltage as a function of temperature and distance so that it has a temperature coefficient (Tco) which is a function of a block or groups of blocks of memory cells being sensed. A fourth solution is to set the reference current (Isense) used for sensing as a function of temperature and distance. A combination of the above solutions can also be used. For example, Vblc can be a function of distance to correct for variations in distance only and the temperature-based resistance change of the BL can be corrected by making the WL voltage (Vcg) a function of temperature and block location.

Figure 2:
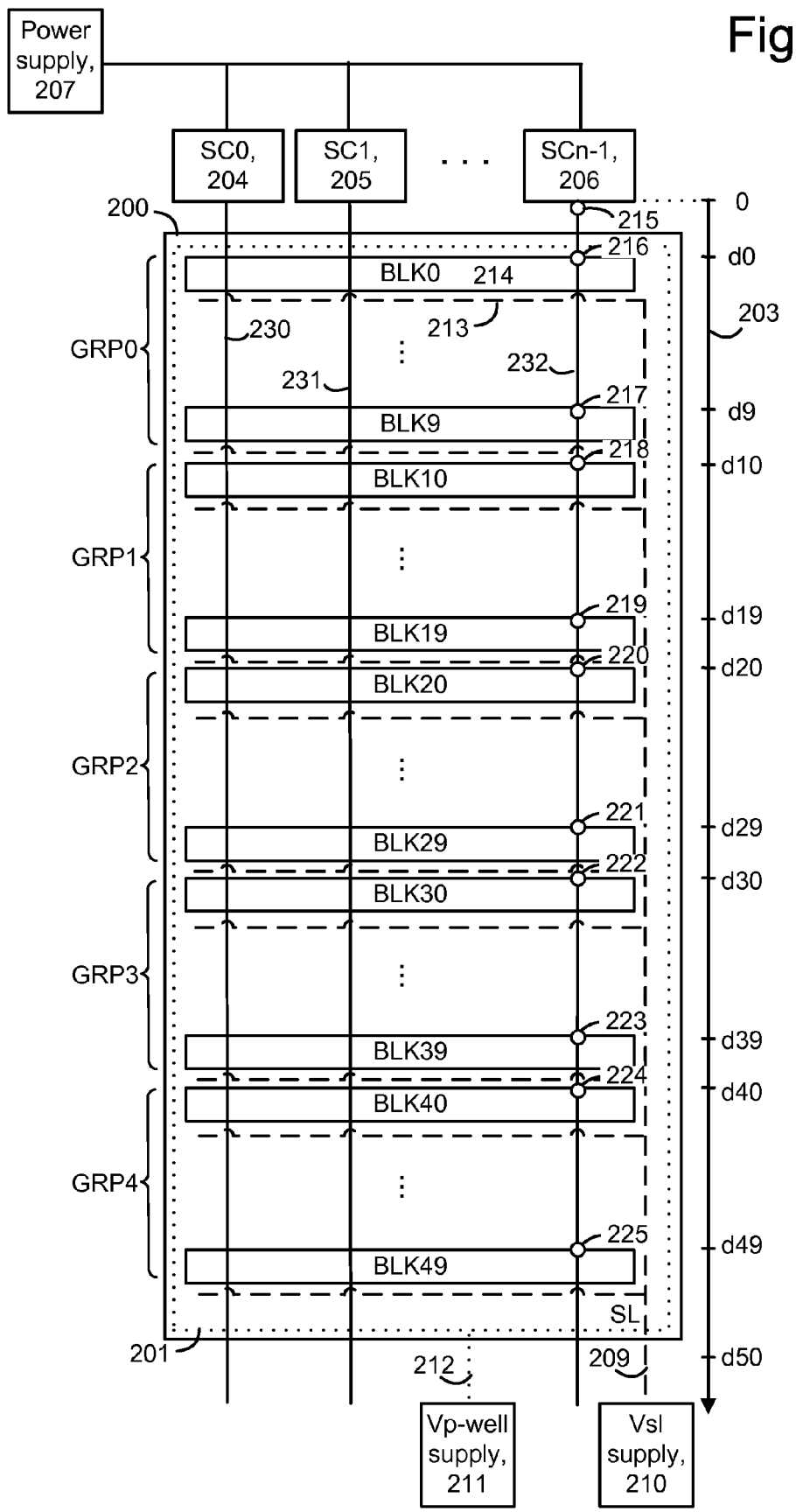
FIG. 2 depicts an example arrangement of groups of blocks in a memory array 200 which represents the memory array 155 of FIG. 1.
Figure 7A:
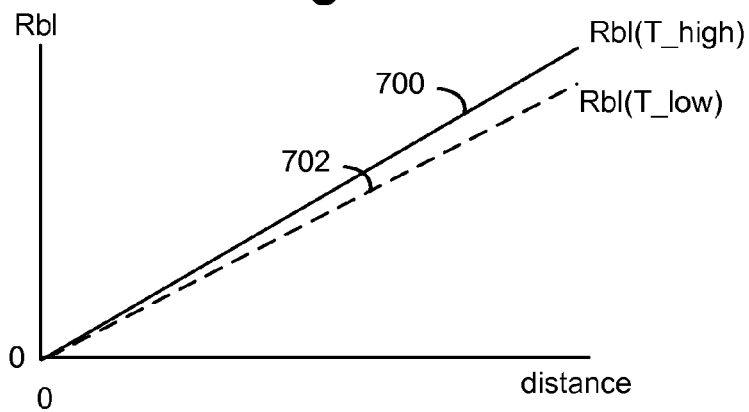
FIG. 7A depicts a bit line resistance as a function of a distance from a sense component to a memory cell being sensed, for different temperatures.

FIGS. 7A to 7H2, discussed below, provide graphs which explain the effects of temperature and distance during sensing, as well as explaining various solutions for compensating for these effects. The various graphs are not necessarily to scale or consistent with one another but are meant to show trends. In some cases, example values and ranges of values are mentioned.

FIG. 7A depicts a bit line resistance as a function of a distance from a sense component to a memory cell being sensed, for different temperatures.

The y-axis depicts Rbl, which denotes the resistance of the distance or length of the bit line. The scale of Rbl is 0 up to one or more mega Ohms, for instance. The x-axis depicts the distance or length of the bit line between the sense component and the memory cell being sensed. Generally, Rbl increases with the distance and Rbl is higher when temperature is higher. T_high denotes a highest temperature which the memory device is designed for, such as 125 C and T_low represents the lowest temperature which the memory device is designed for, such as –40 C. "C" denotes degrees Celsius. Line 700 represents the Rbl at T_high, e.g., Rbl(T_high), and line 702 represents the Rbl at T_low, e.g., Rbl(T_low). Rbl for intermediate temperate are intermediate to these lines. The term "high" or "higher" or the like denote relatively high, and the term "low" or "lower" or the like denote relatively low.

Rbl is also affected by factors which are not shown, such as the sheet resistance of the bit line material and the bit line width. For a given distance, Rbl is higher when the sheet resistance of the bit line material is higher and when the memory device is more scaled (e.g., the bit line is narrower). The voltage drop in the bit line (dVbl=Ibl×Rbl) is a function of Rbl and the current in the bit line. The bit line current (Ibl) can vary in the bit line during sensing. The value of the current (a sense current) at the time the conductivity of the memory cell is evaluated is of concern. This time is a sense time such as Time1 and Time2 in FIG. 6B, discussed further below. Thus, the voltage drop across a bit line varies with block location and temperature.

With continual shrinkage of bit line dimensions in new memory device designs, the absolute temperature dependence of Rbl(T) (e.g., Rbl(T_high)–Rbl(T_low), the difference between lines 700 and 702) is expected to become larger. "T" denotes temperature. This variation in Rbl will be a source of inaccuracy during sensing if not properly compensated.

Figure 7B:
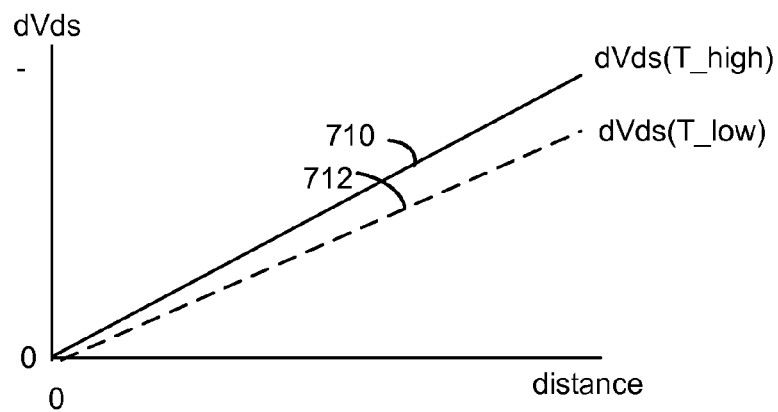
FIG. 7B depicts a change (dVds) in the drain-to-source voltage Vds of a memory cell as a function of a distance from a sense component to the memory cell being sensed and as a function of temperature, consistent with FIG. 7A.

FIG. 7B depicts a change (dVds) in the drain-to-source voltage Vds of a memory cell as a function of a distance from a sense component to the memory cell being sensed and as a function of temperature, consistent with FIG. 7A. The notation of "d" before a voltage "V" as used here and elsewhere represents a delta or difference in the voltage. We have dVds=Ibl×Rbl. Further, Vds=Vblc−Isense×Rbl(T). The y-axis depicts a change in the Vds of a sensed memory cell. If the source voltage (Vsl) is fixed, the y-axis also depicts a change in the drain voltage of a sensed memory cell. The y-axis depicts an increasing negative value since dVds<0. The minus sign "−" denotes a negative value. An example range of dVds is up to the hundreds of millivolts. dVds increases in magnitude with distance, for a given current, since Rbl increases with distance. dVds is also higher in magnitude when temperature is higher. For example, lines 710 and 712 represent dVds(T_high) and dVds(T_low), respectively. Lines for other temperatures can be determined by interpolation. Also, not shown, dVds, is higher in magnitude when the sheet resistance is higher and for a more scaled device. Thus, variations in dVds based on temperature can be a significant factor which can reduce the sensing accuracy if not compensated.

Figure 7C:
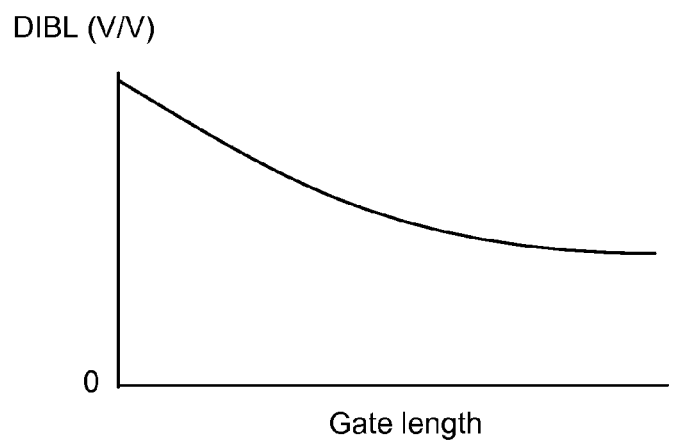
FIG. 7C depicts an increase in the drain induced barrier lowering (DIBL) of a memory cell as a function of a decrease of a gate length of the memory cell.

FIG. 7C depicts an increase in the drain induced barrier lowering (DIBL) of a memory cell as a function of a decrease of a gate length of the memory cell. The x-axis represents the gate length of a memory cell and the y-axis represents DIBL. DIBL increases as the gate length becomes smaller in a more scaled memory device. Example values for DIBL are up to 1.0 V/V and higher. The gate length corresponds to the word line width. As mentioned, DIBL represents a ratio of a decrease in the Vth of a memory cell with an increase in the Vd of the memory cell (or an increase in the Vth with a decrease in Vd). This assumes the control gate and source are at a fixed voltage.

The change in Vth as a function of temperature and DIBL due to temperature-dependent BL Resistance can be expressed by dVth(T)=−dVds(T)×DIBL. As a result, the Vth of a memory cell will change with changes in temperature. This change in Vth is in addition to the memory cell's Vth change which happens due to surface potential being a function of temperature. At lower temperatures, Rbl is lower, as shown in FIG. 7A, so that the voltage drop on the bit line between the sense component and the memory cell being sensed will be lower. As a result, Vd will be higher and Vth will be lower. At higher temperatures, Rbl is higher so that the voltage drop on the bit line between the sense component and the memory cell being sensed will be higher. As a result, Vd will be lower and Vth will be higher. Accordingly, the Vth of a memory cell is not consistent with temperature, especially for highly scaled memory devices, which have a higher Rbl, and for memory devices with long bit lines. Thus, variations in the Vth of a memory cell based on temperature-dependent BL resistance can be a significant factor which can reduce the sensing accuracy if not compensated.

FIG. 7D depicts a change in the threshold voltage (Vth) only due to the temperature-dependent BL resistance (excluding the effect of temperature on surface potential) of a memory cell over a temperature range of T_low to T_high, as a function of a distance from a sense component to a memory cell being sensed.

As mentioned, Vth changes based on changes in Vd, which in turn varies based on changes in Rbl, and Rbl changes with distance. Thus, Vth changes with distance. The y-axis depicts dVth, a change in the Vth of a memory cell, as a function of distance. The x-axis depicts distance, and groups of blocks of memory cells which are arranged at different distances in a memory array, as discussed further in connection with FIG. 2. The groups are denoted GRP0 to GRP4, where GRP0 is closest to the sense component and GRP4 is furthest from the sense component. dVth>0 so that the y-axis depicts a positive "+" value. dVth could vary up to about 50 mV or higher, for instance. Generally, dVth increases with distance. Also, not shown, dVth is higher for a more scaled device than for a less scaled device.

Previously, due to reduced scaling of memory devices, variations in dVds and dVth based on temperature could be ignored without significantly affecting sensing accuracy. However, with scaling of current and future memory devices, variations in dVds and dVth based on temperature are more significant. Sensing techniques provided herein address such variations to improve sensing accuracy.

A first solution for compensating for changes in Rbl with temperature and distance is depicted in FIGS. 7E1 and 7E2.

FIG. 7E1 depicts a clamping voltage Vblc in a sense component changing as a function of a distance from the sense component to a memory cell being sensed and as a function of temperature, where Vblc is temperature-compensated and distance-compensated. Vblc can be up to 0.5 V or higher, for instance.

In this approach, Vblc is controlled so that it increases with distance. Moreover, for a given distance, Vblc is controlled so that it increases with temperature, as depicted in FIG. 7E2. Further, the rate of increase of Vblc per degree C. of temperature, i.e., the Vblc temperature coefficient (Tco) is different for different distances, e.g., different blocks or groups of blocks. The rate of increase of Vblc with distance is higher when the temperature is higher. Lines 740 and 741 represent Vblc for temperatures of T_high and T_low, respectively. It can be seen that the amount of temperature compensation of Vblc is based on both the temperature and the distance.

FIG. 7E2 depicts changes in Vblc as a function of temperature and the distance between the sense component and different groups of blocks of memory cells. Lines 745 to 749 represent Vblc for GRP0 to GP4, respectively. The rate of increase of Vblc with increasing temperature can be higher when the distance is greater (e.g., as the block number increases).

This graph can provide data for any number of distances which are to be compensated. The data can be provided for distances associated with each block or group of blocks of memory cells in a memory array. This data can be accessed during a sensing operation to set Vblc to compensate for changes in Rbl with temperature and distance. The rate of increase of Vblc per degree C. of temperature, i.e., the Vblc temperature coefficient (Tco), is different for the different distances/groups. The rate can be higher when the distance is greater as depicted in FIG. 7E3.

Figure 3:
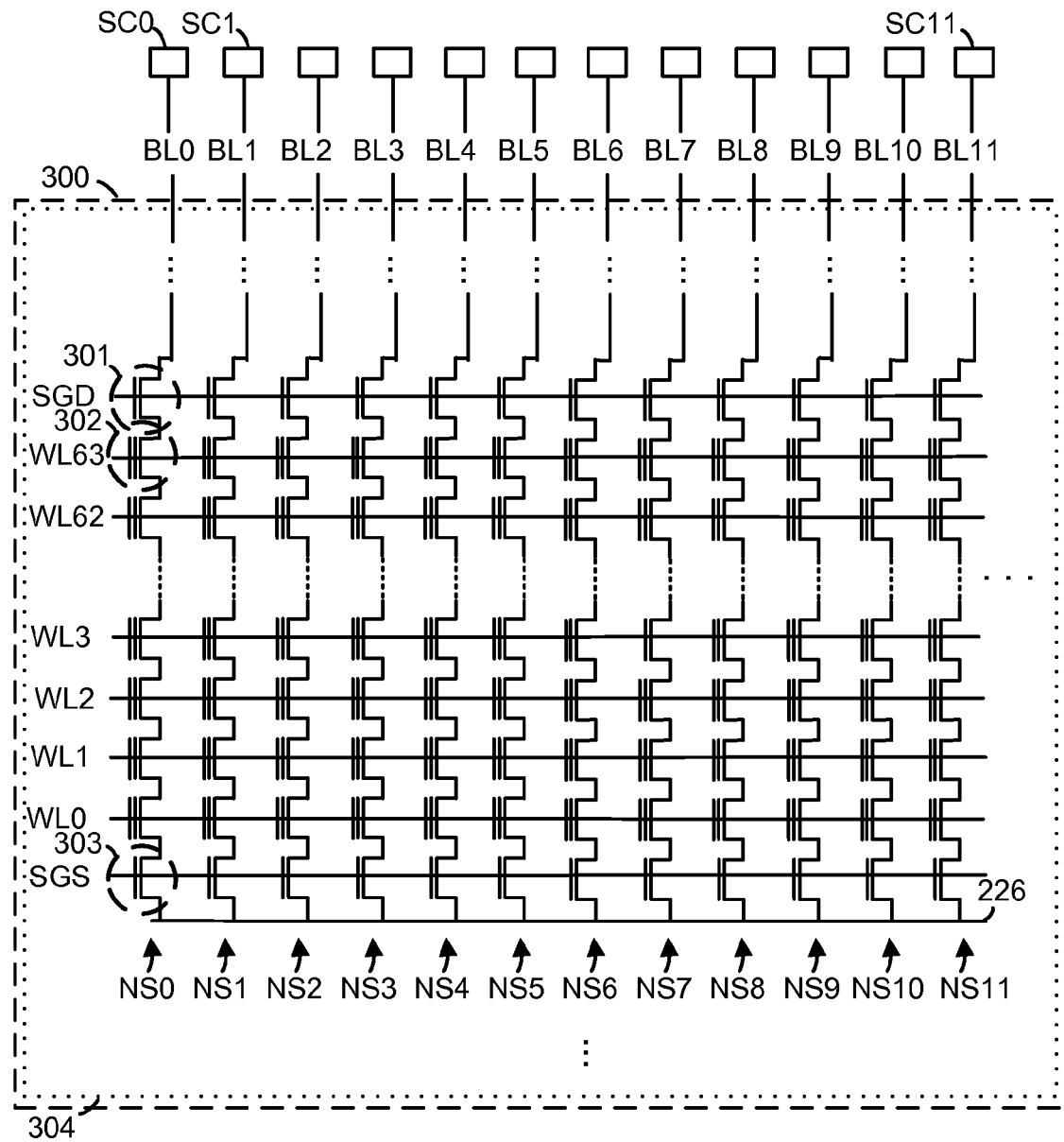
FIG. 3 depicts a 2D block of NAND flash memory cells as an example block in the arrangement of FIG. 2.

FIG. 7E3 depicts a Vblc temperature coefficient (Tco) as a function of distance from a sense component to a memory cell being sensed. In this approach, Vblc has a temperature coefficient that compensates for changes in dVds with temperature, where dVds(T)=Isense×dRbl(T) so that a constant Vds can be provided for memory cells in different blocks or groups of blocks and at different temperatures. As discussed further in connection with FIG. 5A, Vblc can be adjustable using a circuit with a current source and adjustable resistors. A resistor is added which is a function of temperature and distance (Rblc(T,GRP)). The "+" sign on the y-axis indicates that the Tco>0, e.g., Vblc increases with temperature. Further, Tco increases with distance.

FIG. 7F1 depicts a temperature coefficient (Tco) of a word line as a function of a distance from a sense component to a memory cell being sensed, where Tco varies as a function of the distance. According to a second solution for providing distance and temperature compensation of the bit line resistance, a Tco of the word line voltage decreases in magnitude with distance. The "−" sign on the y-axis indicates that the WL Tco is negative (e.g., Tco<0), such that Vwl_sel decreases as T increases. Considering a memory cell in isolation, the Vth of the memory cell decreases as T increases due to changes in the surface potential with temperature. To compensate for this, Vwl_sel can decrease as T increases.

Further, to compensate for the effect of the bit line resistance changing, recall that Vds (or Vd) decreases as distance increases and as temperature increases. Due to the DIBL effect, the Vth of a memory cell increases as Vd decreases. This partially offsets the decrease in the Vth as T increases so that a smaller magnitude of Tco can be used as distance increases. Thus, the amount of temperature compensation of the word line voltage is based on both the temperature and the distance. A different WL Tco can be set by the control for each group, for instance.

FIG. 7F2 depicts Vwl_sel as a function of temperature and distance from a sense component to a memory cell being sensed, for groups GRP0 to GRP4 of FIG. 7F1. The y-axis depicts Vwl_sel, the voltage of a selected word line. Vwl_sel_nom (represented by the circle) is a nominal or baseline level which is defined at a specific temperature Tnom, such as a room temperature, and a reference distance such as for GRP0. The WL Tco is a function of distance so that the Tco has a steeper slope for groups which are closer to the sense component. For example, lines 750 to 754 represent the WL Tco for GRP0 to GRP4, respectively.

Vwl_sel is controlled so that it decreases as temperature increases. Adjusting Vwl_sel allows the Vth of the memory cell to remain the same regardless of Vds changing with temperature. The shift in Vwl_sel (the control gate voltage Vcg of a memory cell) can compensate for the dVth changes caused by both dRbl and the DIBL effect (dVth=Ibl×dRbl×DIBL), where dRbl is the change in the bit line resistance. The WL Tco becomes a function of the block or group of blocks. The WL Tco drops by dVth/dT where dVth=dVds×DIBL and dT is a change in temperature.

Vwl_sel can thus be set as a function of the distance and temperature. As discussed further in connection with FIG. 5B, Vwl_sel can be adjustable using a circuit with a current source and adjustable resistors. A resistor can be added which is a function of temperature and distance (Rwl(T,GRP)).

FIG. 7G1 depicts a temperature coefficient (Tco) of a source line (SL) as a function of a distance from a sense component to a memory cell being sensed. According to a third solution for providing distance and temperature compensation of the bit line resistance, a Tco of the source line voltage decreases in magnitude with distance. The y-axis has a "+" sign, indicating that the SL Tco>0, in one approach. This is opposite to the WL Tco, which is negative. When T increases, Vth decreases and to compensate for this, Vsl is set to increase. Thus, the amount of temperature compensation of the source line voltage is based on both the temperature and the distance. A different SL Tco can be set by the control for each group, for instance.

FIG. 7G2 depicts Vsl as a function of temperature and distance from a sense component to a memory cell being sensed, for distances represented by GRP0 to GRP4, consistent with FIG. 7G1. Vsl_nom (represented by the circle) is a nominal or baseline level which is defined at a specific temperature Tnom, such as a room temperature, and a specific distance/group such as GRP0. The SL Tco is a function of distance/group so that the groups which are closer to the sense component have a relatively steeper slope of Vsl versus temperature. For example, lines 760 to 764 represent Vsl for GRP0 to GRP4, respectively. Vsl can thus be set by the control as a function of the distance/group and temperature. Vsl increases at a faster rate with temperature when the distance is smaller.

In one approach, Vsl and Vwl_sel are changed to achieve a constant Vds and Vgs regardless of Vbl changing with temperature. For example, Vsl and Vwl_sel can both be adjusted by the same amount, e.g., dVds. Thus, Vsl=Vsl_nom+dVds and Vwl_sel=Vwl_sel_nom+dVds.

In another approach, Vsl (but not Vwl_sel) is changed to compensate for a change in Vds to obtain a constant Vth in the memory cell. For example, −dVsl=[DIBL/(1+DIBL)]×dVds.

Further, if the source line is not tied to the p-well such that Vsl does not equal Vp-well, the body effect can be considered, so that dVsl will be different from the case where source line is tied to the p-well.

As discussed further in connection with FIG. 5C, Vsl can be adjustable using a circuit with a current source and adjustable resistors. A resistor is added which is a function of temperature and distance (Rsl(T,GRP)).

Figure 6B:
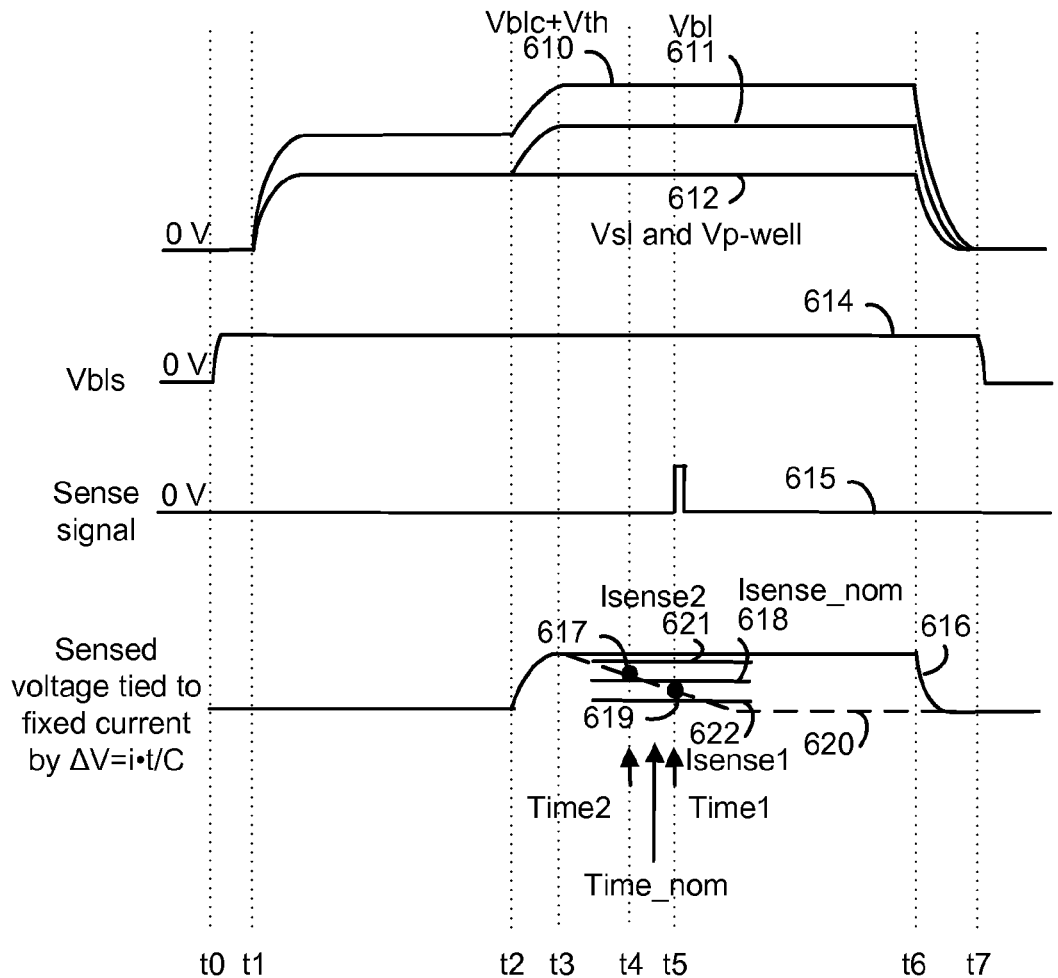
FIG. 6B depicts voltage waveforms in an example sense operation.

FIG. 7H1 depicts a sense current as a function of a distance from a sense component to a memory cell being sensed, and as a function of temperature. According to a fourth solution for providing distance and temperature compensation of the bit line resistance, a sense current (Isense) decreases with the distance/group. Changing Isense compensates for the dVds and dVt with temperature. A higher Isense makes it more difficult for a memory cell to be found to be in a conductive state by the sensing operation since the current in the cell has to exceed Isense. If Vwl_sel and Vwl are not compensated, a memory cell at a larger distance with have a higher Vth (due to the higher Rbl and the resulting lower Vd and DIBL effect) so that a lower current will pass in the cell for a given Vwl_sel. Refer also to FIG. 6B and the example Isense levels of Isense1 (line 622), Isense_nom (line 618) and Isense2 (line 621). To compensate the sensing operation based on distance, Isense can be set by the control to decrease with distance. Further, Isense can be increased at a faster rate for higher temperatures since Rbl is higher with higher temperatures. Line 770 represents Isense at T_high and line 771 represents Isense at T_low. Isense_nom (represented by the circle) is a nominal sense current which is used at Tnom, a nominal or default temperature and for GRP2, a nominal or default distance/group.

FIG. 7H2 depicts a sense time as a function of a distance from a sense component to a memory cell being sensed, and as a function of temperature. According to a fifth solution for providing distance and temperature compensation of the bit line resistance, a sense time (Time) increases with distance. Changing the sense time compensates for changes in dVds and dVt with temperature. Refer also to FIG. 6B and example sense times of Time1, Time_nom and Time2. To compensate the sensing operation based on distance, the sense time can be increased with distance. A shorter sense time makes it more difficult for a memory cell to be found to be in a conductive state by the sensing operation since the current in the cell has to exceed Isense at the sense time. Further, the sense time can be increased at a faster rate for lower temperatures. Line 775 the sense time at T_low and line 776 represents the sense time at T_high. Time_nom (represented by the circle) is a nominal sense time which is used at Tnom and for a nominal distance represented by GRP2. Sense time is inversely proportional to Isense and therefore has an opposite slope versus distance compared to FIG. 7H1.

In another option, the sense time is changed and this changes the sense current. Generally, combinations of the various solutions can be used together.

Figure 8A:
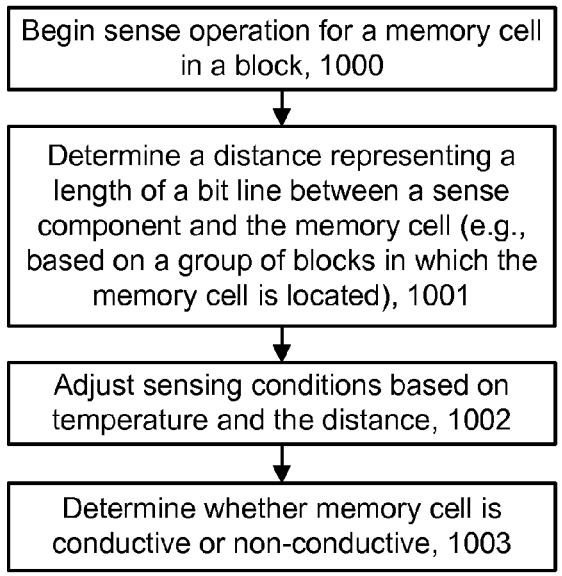
FIG. 8A depicts a flowchart of a method for sensing a memory cell which adjusts for temperature and a distance from a sense component to the memory cell being sensed.

FIG. 8A depicts a flowchart of a method for sensing a memory cell which adjusts for temperature and a distance from a sense component to the memory cell being sensed. The steps include: begin sense operation for a memory cell in a block, 1000; determine a distance representing a length of a bit line between a sense component and the memory cell (e.g., based on a block or group of blocks in which the memory cell being sensed is located), 1001; adjust sensing conditions based on temperature and the distance, 1002; and determine whether the memory cell is conductive or non-conductive, 1003.

Figure 8B:
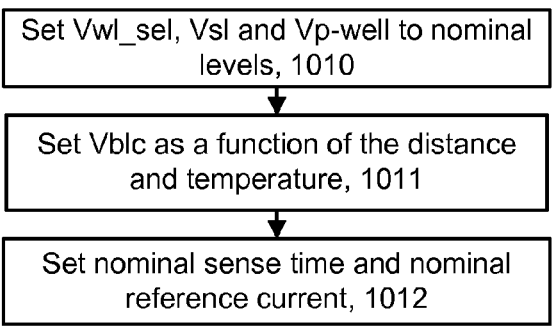
FIG. 8B depicts a flowchart of an example implementation of step 1002 of FIG. 8A, where a bit line clamping voltage Vblc is set as a function of the distance from the sense component to the memory cell being sensed and as a function of temperature, consistent with the solution of FIGS. 7E1 to 7E3.

FIG. 8B depicts a flowchart of an example implementation of step 1002 of FIG. 8A, where a bit line clamping voltage Vblc is set as a function of the distance from the sense component to the memory cell being sensed and as a function of temperature, consistent with the solution of FIGS. 7E1 to 7E3. The steps include: set Vwl_sel, Vsl and Vp-well to nominal levels (e.g., Vwl_sel_nom, Vsl_nom and Vp-well_nom, respectively), 1010; set Vblc as a function of the distance and temperature, 1011; and set nominal sense time and nominal reference current, 1012.

Figure 8C:
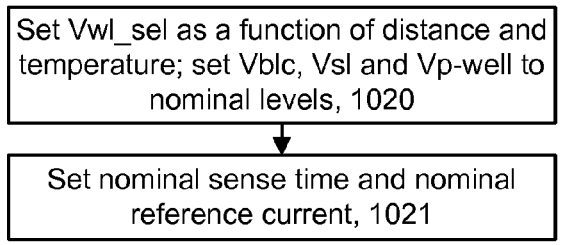
FIG. 8C depicts a flowchart of an example implementation of step 1002 of FIG. 8A, where a selected word line voltage Vwl_sel is set as a function of the distance from the sense component to the memory cell being sensed and as a function of temperature, consistent with the solution of FIGS. 7F1 and 7F2.

FIG. 8C depicts a flowchart of an example implementation of step 1002 of FIG. 8A, where a selected word line voltage Vwl_sel is set as a function of the distance from the sense component to the memory cell being sensed and as a function of temperature, consistent with the solution of FIGS. 7F1 and 7F2. The steps include: set Vwl_sel as a function of distance and temperature; set Vblc, Vsl and Vp-well to nominal levels (e.g., Vblc_sel_nom, Vsl_nom and Vp-well_nom, respectively), 1020; and set nominal sense time and nominal reference current, 1021.

Figure 8D:
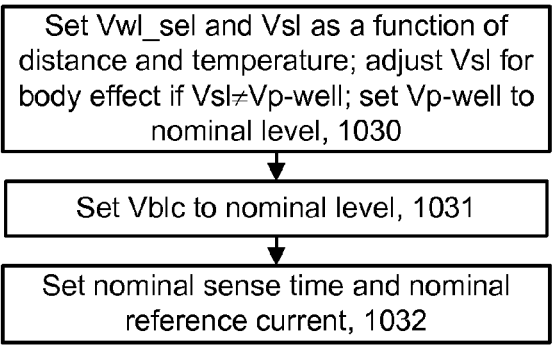
FIG. 8D depicts a flowchart of an example implementation of step 1002 of FIG. 8A, where a selected word line voltage Vwl_sel and a source line voltage Vsl are set as a function of the distance from the sense component to the memory cell being sensed and as a function of temperature, consistent with the solution of FIGS. 7F1 and 7F2 and 7G1 and 7G2.

FIG. 8D depicts a flowchart of an example implementation of step 1002 of FIG. 8A, where a selected word line voltage Vwl_sel and a source line voltage Vsl are set as a function of the distance from the sense component to the memory cell being sensed and as a function of temperature, consistent with the solution of FIGS. 7F1 and 7F2 and 7G1 and 7G2. The steps include: set Vwl_sel and Vsl as a function of distance and temperature; adjust Vsl for body effect if Vsl does not equal Vp-well; set Vp-well to nominal level, 1030; set Vblc to nominal level, 1031; and set nominal sense time and nominal reference current, 1032.

Figure 8E:
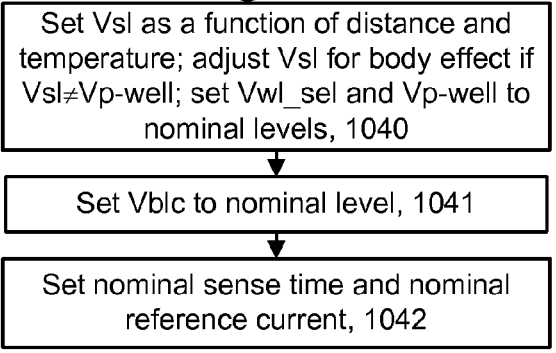
FIG. 8E depicts a flowchart of an example implementation of step 1002 of FIG. 8A, where a source line voltage Vsl is set as a function of the distance from the sense component to the memory cell being sensed and as a function of temperature, consistent with the solution of FIGS. 7G1 and 7G2.

FIG. 8E depicts a flowchart of an example implementation of step 1002 of FIG. 8A, where a source line voltage Vsl is set as a function of the distance from the sense component to the memory cell being sensed and as a function of temperature, consistent with the solution of FIGS. 7G1 and 7G2. The steps include: set Vsl as a function of distance and temperature; adjust Vsl for body effect if Vsl does not equal Vp-well; set Vwl_sel and Vp-well to nominal levels, 1040; set Vblc to nominal level, 1041; and set nominal sense time and nominal reference current, 1042.

Figure 8F:
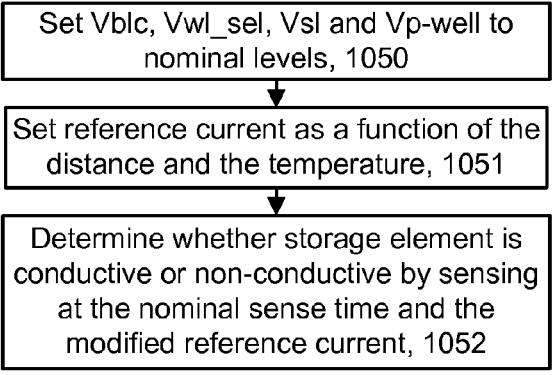
FIG. 8F depicts a flowchart of an example implementation of step 1002 of FIG. 8A, where a demarcation level in a sense operation is set as a function of the distance from the sense component to the memory cell being sensed and as a function of temperature, consistent with the solution of FIG. 7H1.

FIG. 8F depicts a flowchart of an example implementation of step 1002 of FIG. 8A, where a demarcation level in a sense operation is set as a function of the distance from the sense component to the memory cell being sensed and as a function of temperature, consistent with the solution of FIG. 7H1. The steps include: set Vblc, Vwl_sel, Vsl and Vp-well to nominal levels, 1050; set reference current as a function of the distance and the temperature, 1051; and determine whether storage element is conductive or non-conductive by sensing at the nominal sense time and the modified reference current, 1052.

Figure 8G:
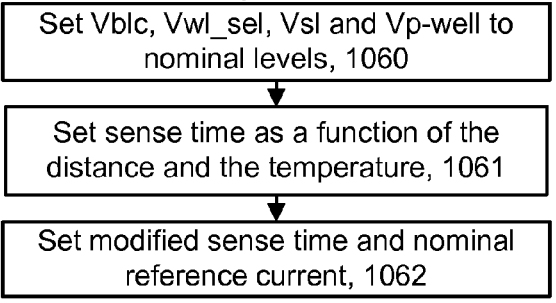
FIG. 8G depicts a flowchart of an example implementation of step 1002 of FIG. 8A, where a sense time in a sense operation is set as a function of the distance from the sense component to the memory cell being sensed and as a function of temperature, consistent with the solution of FIG. 7H2.

FIG. 8G depicts a flowchart of an example implementation of step 1002 of FIG. 8A, where a sense time in a sense operation is set as a function of the distance from the sense component to the memory cell being sensed and as a function of temperature, consistent with the solution of FIG. 7H2. The steps include: set Vblc, Vwl_sel, Vsl and Vp-well to nominal levels, 1060; set sense time as a function of the distance and the temperature, 1061; and set modified sense time and nominal reference current, 1062.

An example memory system which can be used is discussed next. Generally, any type of non-volatile memory can be used, e.g., BiCS, TCAT, VSAT, VG-NAND and 2D NAND.

A memory with NAND strings is an example only. FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense components 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense components 100, read/write circuits 165, and controller 150, and so forth.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

FIG. 2 depicts an example arrangement of groups of blocks in a memory array 200 which represents the memory array 155 of FIG. 1. Typically, a memory array can include many blocks of memory cells which share a common set of bit lines. Each block may be independently erasable or otherwise controllable. Due to the sharing of bit lines among the blocks, sensing may be performed for one block at a time. For example, sensing may be performed for memory cells associated with a selected word line in a block. The memory array 200 may include a p-well region 201 in a substrate such as in the case of 2D NAND. A p-well supply 211 is a power source which can provide a voltage to the p-well via a path 212. The array further includes a number of blocks referred to as BLK0 214 to BLK49. In this case, there are fifty blocks. Example bit lines 230, 231, . . . , 232 are depicted as being associated with respective sense components SC0 (204), SC1 (205), . . . , SCn−1 (206). The number of bit lines is n which is typically much greater than the number of blocks in the memory array. In one approach, there is one bit line for each memory cell on a word line. In other approaches, a bit line is shared by adjacent memory cells on a word line so that sensing occurs in a time-sharing manner. A power supply 207 provides a supply voltage Vdd to the sense components.

An axis 203 represents a distance from the sense components to the blocks. This distance is essentially the length of the bit line between the sense components and the blocks. For example, point 215 is at a distance 0 on the axis to represent the location of the sense component and the start of the bit line. Point 216 is at a distance d0 along the axis to represent a distance of the bit line between the sense component and BLK0. This location can represent the part of the block which is closest to the sense component, a midpoint of the block along the axis 203 or some other location in the block. Similarly, points 217, 218, 219, 220, 221, 222, 223, 224, and 225 are at distances d9, d10, d19, d20, d29, d30, d39, d40 and d49, respectively, to represent a distance of the bit line between the sense component SCn−1 and BLK9, BLK10, BLK19, BLK20, BLK29, BLK30, BLK39, BLK40 and BLK49, respectively.

Thus, one approach is to define a distance of the bit line between each group and the sense component. A finer grained approach is to provide a distance of the bit line between each word line and the sense component, although this amount of detail may be excessive. A coarser grained approach is to assign adjacent blocks into a set of blocks, and provide a distance of the bit line between each group of blocks and the sense component. For example, groups GRP0, GRP1, GRP2, GRP3 and GRP4, discussed previously in connection with FIGS. 7A to 7H1, can include BLK0 to BLK9, BLK10 to BLK19, BLK20 to BLK29, BLK30 to BLK39 and BLK40 to BLK49. In this example, each group include an equal number of blocks. However, different approaches are possible. For example, the number of blocks in a group can become progressively smaller, moving away from or toward the sense component. A state machine or other on-chip control circuit can store data regarding the assignment of the blocks to the groups. The far end of each bit line can be connected to ground.

Further, a Vsl (source line voltage) power supply 210 is connected to a source line 209 which has branches for each block, such as branch 213 for BLK0. The far end of each source line branch can be connected to ground.

FIG. 3 depicts a 2D block of NAND flash memory cells as an example block in the arrangement of FIG. 2. A memory array 300 includes p-well 304 on which a number of NAND strings NS0 to NS11 are formed. A drain end of each NAND string is connected to a respective bit line BL0 to BL11 and a source end of each NAND string is connected to a common source line 226. SC0 to SC11 are sense components associated with bit lines BL0 to BL11, respectively.

Each NAND string is connected at one end to a drain select gate (SGD), and the control gates of the drain select gates are connected via a common SGD line. Each NAND string is connected at its other end to a source select gate which, in turn, is connected to the common source line. For example, NS0 includes a source side select gate transistor 303 and a drain side select gate transistor 301. Example storage element 302 is in NS0 and is connected to WL63, an example of a selected word line which is connected to one or more memory cells to be undergo a sensing operation. Other storage elements connected to WL63 can also be selected storage elements. Sixty-four word lines, for example, WL0-WL63, extend between the source-side select gates and the drain-side select gates. In one approach, the sense components are grouped and share a memory controller.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

The 2D NAND string is formed on a substrate. In one approach, the substrate includes a p-well region 304 within an n-well region, which in turn is within a p-type substrate region. The NAND string and its non-volatile storage elements can be formed, at least in part, on the p-well region.

Figure 4A:
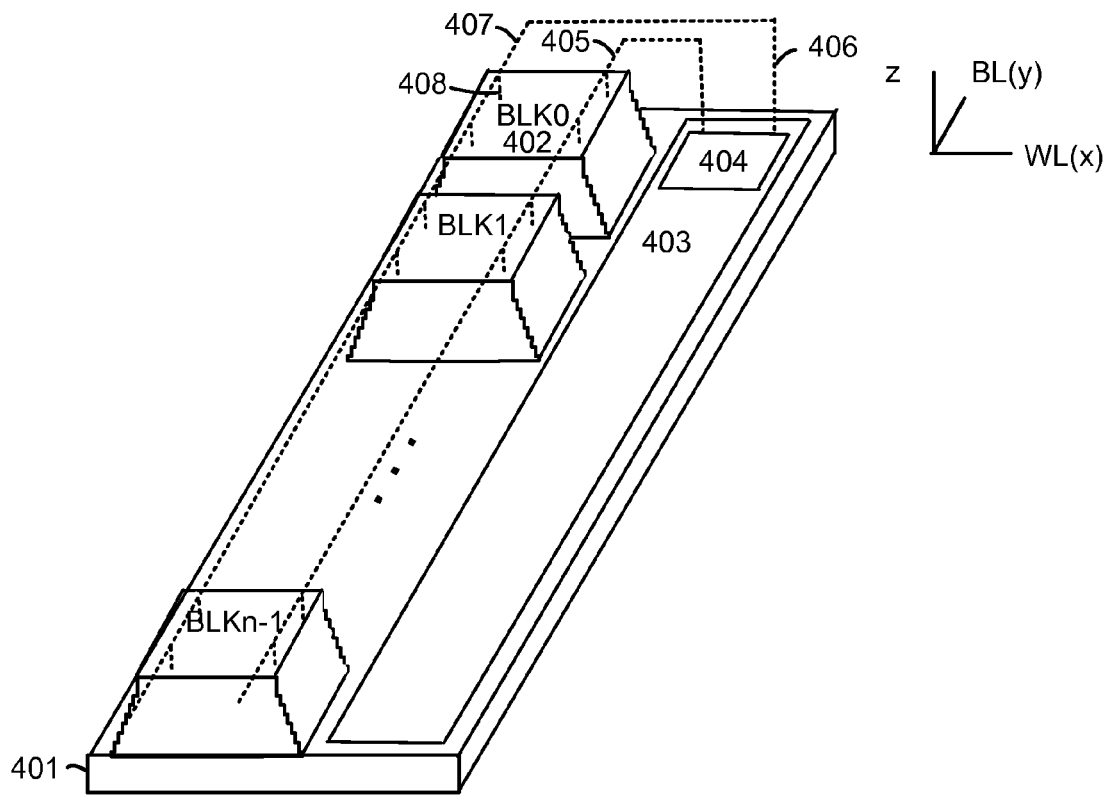
FIG. 4A depicts a perspective view of 3D blocks of NAND flash memory cells as another example of blocks in the arrangement of FIG. 2.

FIG. 4A depicts a perspective view of 3D blocks of NAND flash memory cells as another example of blocks in the arrangement of FIG. 2. The memory device 400 includes a substrate 401. On the substrate are a number n example blocks BLK0 (402), BLK1, . . . , and BLKn−1 of memory cells and a peripheral area 403 with sensing circuitry 404 for use by the blocks. The substrate can also carry circuitry under the blocks, along with one or more lower metal layers which are patterned in conductive paths to carry signals of the circuitry. The blocks are formed in an intermediate region of the memory device. In an upper region of the memory device, one or more upper metal layers are patterned in conductive paths including bit lines to carry signals of the circuitry. One example bit line includes a vertical (z direction segment) 406 and a segment 407 which extends in a bit line (−y) direction. Vertical portions such as a vertical portion 408 extend between the bit line and drain ends of NAND strings in the blocks, in one approach. Another example bit line 405 is also depicted. The distance of each bit line from the sensing components in the sensing circuitry 404 to a block or group of blocks can be determined for use in providing temperature compensating during sensing as described further below.

Figure 4B:
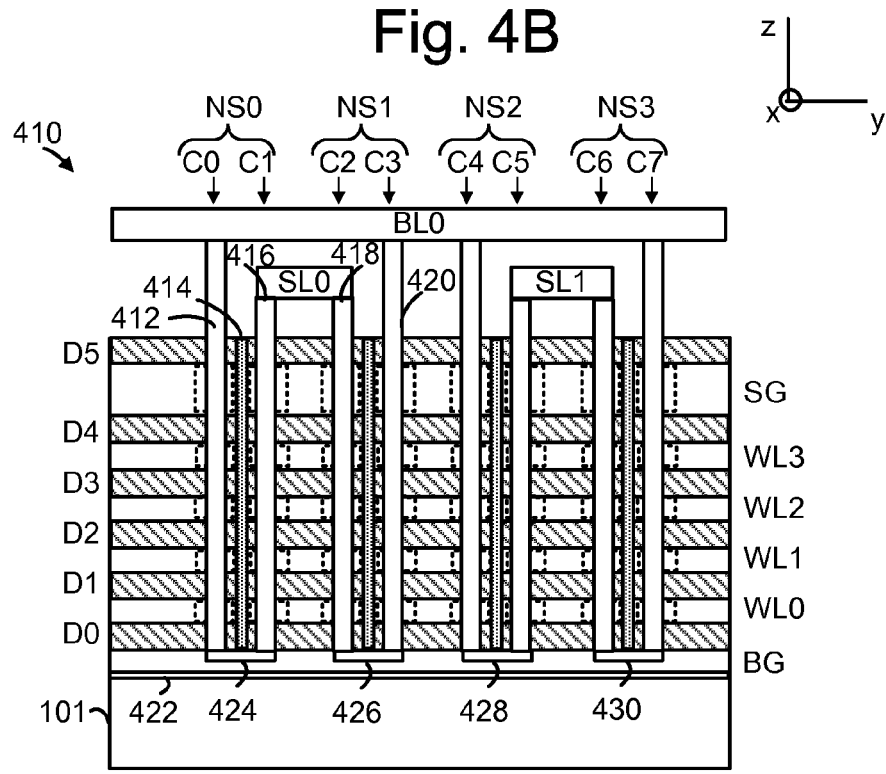
FIG. 4B depicts a cross-sectional view of one of the 3D blocks of FIG. 4A.

In one approach, each block comprises a stacked area of memory cells, where alternating levels of the stack represent word lines separated by dielectric layers, as shown in FIG. 4B. While a row of blocks are depicted extending in the −y direction as an example, additional blocks can be used, extending, e.g., in the x-direction.

FIG. 4B depicts a cross-sectional view of one of the 3D blocks of FIG. 4A. Vertical columns of memory cells C0 to C7 are depicted in the multi-layer stack. The stack 410 includes the substrate 101, an insulating film 422 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 424, 426, 428 and 430 which connect the columns. The back gate thus connects the two columns of each U-shaped NAND string. For example, a NAND string NS0 includes columns C0 and C1 and connecting portion 424. NS0 has a drain end 412 and a source end 416. NS1 includes columns C2 and C3 and connecting portion 426. NS1 has a drain end 420 and a source end 418. NS2 includes columns C4 and C5 and connecting portion 428. NS3 includes columns C6 and C7 and connecting portion 430.

The source line SL0 is connected to the source ends 416 and 418 of two adjacent memory strings NS0 and NS1. The source line SL0 is also connected to other sets of memory strings which are behind NS0 and NS1 in the x direction. Additional U-shaped NAND strings in the stack 410 extend behind the U-shaped NAND strings depicted in the cross-section, e.g., along the x-axis. The U-shaped NAND strings NS0 to NS3 are each in a different SGD line subset, but are in a common BL subset.

In the cross-section, multiple insulating slit portions are seen, such as slit 414, where each slit portion is between the drain- and source-side columns of a U-shaped NAND string. A portion of the bit line BL0 is also depicted. The short dashed lines in the SG layer depicts select gate transistors and the short dashed lines in the WL layers (WL0-WL3) depict memory cells.

Figure 5A:
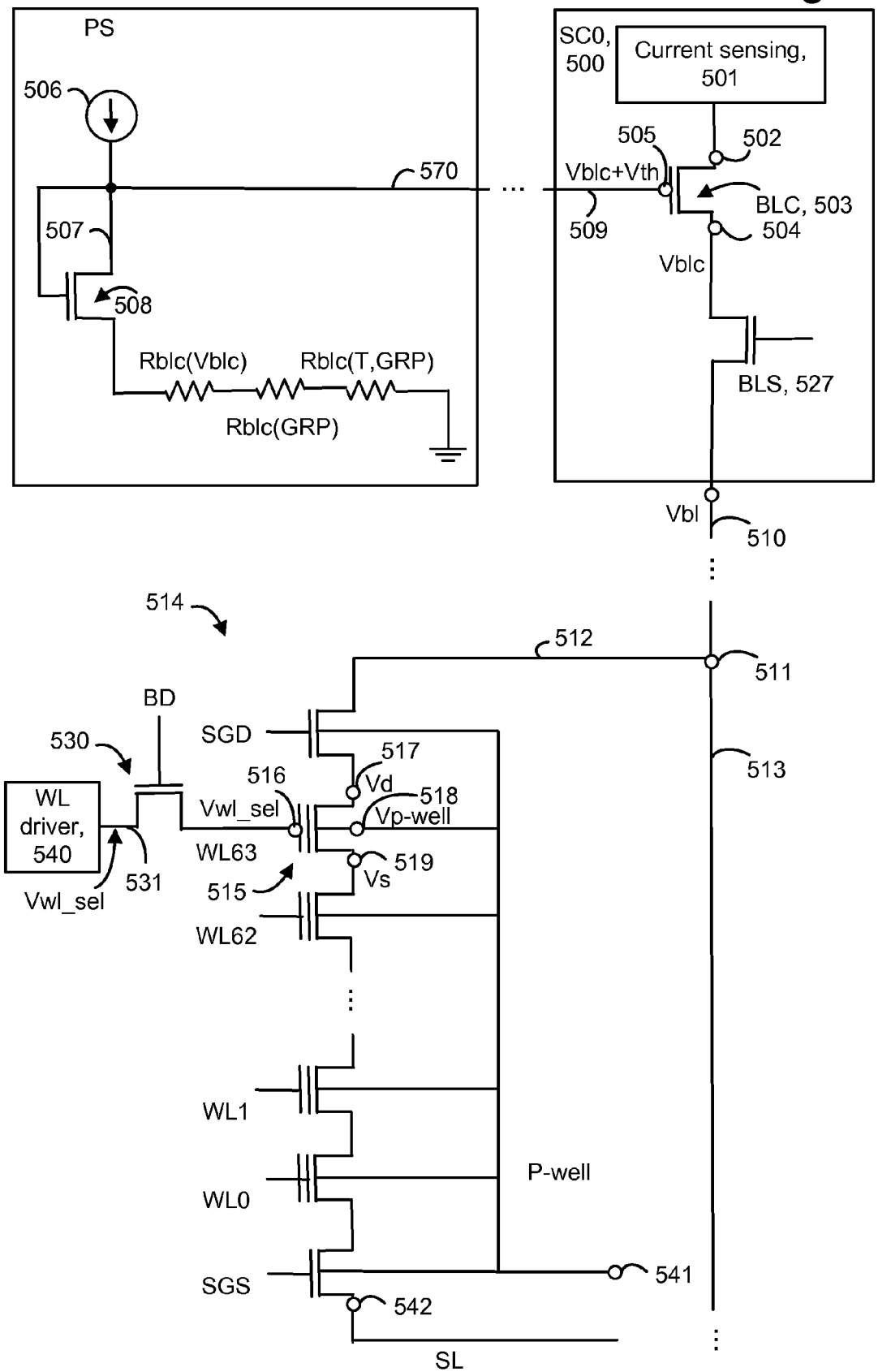
FIG. 5A depicts an example embodiment of the sense component SC0 of FIGS. 1, 2 and 3A which compensates a bit line voltage based on temperature and a distance from the sense component to a group of blocks in which a memory cell is sensed in an example NAND string.

FIG. 5A depicts an example embodiment of the sense component SC0 of FIGS. 1, 2 and 3A which compensates a bit line voltage based on temperature and a distance from the sense component to a group of blocks in which a memory cell is sensed in an example NAND string. The sense component is used to ascertain the condition of a memory cell. For example, in a program-verify operation, the sense component determines whether the Vth of the memory cell has reach a level associated with a target data state. In a read operation, the sense component determines the data state of the cell based on its Vth.

For example, FIG. 6A depicts example threshold voltage distributions and voltages used for read and verify operations. The x-axis indicates a threshold voltage and the y-axis indicates a number of storage elements. In this example, there are four data states.

Storage elements can be programmed so that their threshold voltages are in respective ranges which represent data states. Initially, an erase operation is performed which places all of the storage elements in the erased state (E) (distribution 600). Subsequently, some of the storage elements can be programmed to a higher threshold voltage such as to represent the A, B or C target data states, for instance, represented by distributions 601, 602 and 603, respectively. In this example, a lower and higher verify level are used for each target data state. The lower verify levels are VvAL, VvBL and VvCL of target data states A, B or C, respectively. The higher verify levels are VvAH, VvBH and VvCH of target data states A, B or C, respectively. Once a memory cell has reached the lower verify level but not the higher verify level, the programming speed can be slowed down such as by raising Vbl during subsequent program pulses. Once a memory cell has reached the higher verify level, the programming is fully inhibited such as by raising Vbl to Vdd during subsequent program pulses.

A subsequent read operation can use the levels VreadA, VreadB and VreadC to determine the data state of a memory cell.

Referring again to FIG. 5A, the sense component SC0 500 comprises a current sensing circuit 501 connected to a drain terminal 502 of a BLC (bit line clamping) transistor 503. A source terminal 504 of the BLC transistor is connected to a bit line 510 via a bit line sensing (BLS) transistor. A control gate 505 of the BLC transistor is connected to a circuit which provides a voltage having a value of Vblc+Vth on a path 509, where Vth is a threshold voltage of the BLC transistor. As a result of this control gate voltage, a voltage Vblc=Vbl is provided on the bit line. Various approaches may be used to provide Vblc+Vth. In one possible approach, a power supply (PS) is shared among the different sense components. The PS includes a current source 506 which provides a current on a path 507 and via a transistor 508 to adjustable resistors. A modified voltage is thereby provided at a terminal 570 to each sense component. Typically, sensing occurs in parallel for multiple sense components.

For example, a first adjustable resistor has a resistance denoted by Rblc(Vblc) to show that its resistance is a function of the voltage Vblc (or Vblc+Vth). A second adjustable resistor has a resistance denoted by Rblc(GRP) to show that its resistance is a function of a group (GRP) of blocks comprising one or more memory cells being sensed. Essentially, the resistance is a function of a distance from the sensing component to the group of blocks. In another approach, the resistance is a function of a distance from the sensing component to the block comprising the one or more memory cells being sensed.

A third adjustable resistor has a resistance denoted by Rblc(T,GRP) to show that its resistance is a function of a temperature (T) of the memory device and of the block or group (GRP) of blocks comprising the one or more memory cells being sensed. The adjustable resistors can be configured with a desired resistance based on control signals, in one approach. The resistors could optionally be combined, e.g., to provide one resistor which varies with T and GRP, or one resistor which varies with distance and another resistor which varies with T. The resistors are connected in series in this approach.

In one approach, a nominal level of Vblc+Vth is defined (e.g., Vblc_nom or (Vblc+Vth)_nom) which is appropriate for a reference condition comprising a reference location of a block or a group of blocks in a memory array and a reference temperature. For example, the reference location may be the block or group of blocks (e.g., GRP0) which is closest to the sensing component. Rblc(Vblc) can be set to a reference resistance to provide this reference level of Vblc+Vth. Rblc (GRP) and Rblc(T,GRP) can have a value of zero in this case. For a location of a block or group of blocks which is relatively far from the sensing component, Rblc(GRP) is relatively high. Moreover, for a temperature which is above or below the reference temperature, Rblc(T,GRP) can be relatively high or low, respectively. Further, the amount by which Rblc(T,GRP) is increased is relatively greater when the block or group of blocks is relatively further from the sensing component. Further details were discussed previously, e.g., in connection with FIGS. 7A to 7H1.

An example NAND string 514 includes storage elements which are in communication with word lines WL0, WL1, WL2 . . . WL62 and WL63. For example, a memory cell 515 has a control gate 516 which receives a voltage Vwl_sel, a drain 517 which receives a voltage Vd, a source 519 which receives a voltage Vs and a body 518 which receives a voltage Vp-well. Vw_sel is supplied by a WL driver 540 via a line 531 and a transfer transistor 530. In practice, a separate word line driver can be provided for each word line and SGD and SGS line. A block decoder (BD) signal can cause each transfer transistor to pass the respective voltage.

The BLS transistor 527 is a high voltage transistor, and is opened in response to a control signal during sense operations. The BLC transistor is a low voltage transistor which is opened in response to a control signal to allow the bit line to communicate with the current sensing module 501.

In an example implementation using the configuration of FIG. 5A, the resistance of the bit line is compensated for variations in the distance (e.g., the bit line length) between the sensed block or group of blocks and the sense component, and for variations in temperature. In other implementations, the distance and temperature compensation is achieved by modifying Vwl_sel (see FIG. 5B) and/or Vsl (FIG. 5C).

FIG. 5B depicts an example circuit which compensates a selected word line voltage Vwl_sel based on temperature and a distance from a sense component to a group of blocks in which a memory cell is sensed. The circuit 550 represents an example implementation of the Vwl_sel driver 540 of FIG. 5A. The circuit includes a current source 551, an output line 553 on which Vwl_sel is provided to the selected word line, a transistor 552 and one or more resistors. A first adjustable resistor, Rwl(Vwl_sel) provides a desired reference level of Vwl_sel. The resistance is a function of the desired Vwl_sel. If a distance based compensation for bit line resistance is provided by varying Vwl_sel, a second resistor Rwl(GRP) may be provided having a resistance which is a function of the block or group of blocks of the sensed memory cell. If a temperature based compensation for bit line resistance is provided by varying Vwl_sel, a third resistor Rwl(T,GRP) may be provided having a resistance which is a function of the block or group of blocks and of the temperature. Rwl(GRP) and Rwl(T,GRP) can be set based on GRP and T as discussed. The resistors are connected in series in this approach.

FIG. 5C depicts an example circuit which compensates a source line voltage Vsl based on temperature and a distance from a sense component to a group of blocks in which a memory cell is sensed. The circuit 560 represents an example implementation of the SL supply 210 of FIG. 2. The circuit includes a current source 561, an output line 563 on which Vsl is provided to the source line, a transistor 562 and one or more resistors. A first adjustable resistor, Rwl(Vsl) provides a desired reference level of Vsl. The resistance is a function of the desired Vsl. If a distance based compensation for bit line resistance is provided by varying Vsl, a second resistor Rsl (GRP) may be provided having a resistance which is a function of the block or group of blocks of the sensed memory cell. If a temperature based compensation for bit line resistance is provided by varying Vsl, a third resistor Rsl(T,GRP) may be provided having a resistance which is a function of the block or group of blocks and of the temperature. Rsl(GRP) and Rsl(T,GRP) can be set based on GRP and T as discussed. The resistors are connected in series in this approach.

FIG. 6B depicts voltage waveforms in an example sense operation. Referring also to FIG. 5A, during a sense operation, such as a read or verify operation, a pre-charge operation occurs in which a capacitor in the current sensing module 501 is charged. Vwl_sel is applied to the selected word line according to the condition which is to be sensed, and Vp-well and Vsl are set to desired levels. The p-well is represented by a terminal 541 which may receive Vp-well. The voltages of the unselected word lines are set to a high level to provide the associated memory cells in a conductive state and the SGD and SGS transistors are also made conductive. The BLS transistor 527 is also made conductive. Subsequently, at a start of a sensing period, Vblc is raised to render the BLC transistor in a conductive state, allowing the current sensing module to communicate with the bit line. At a sense time, the current sensing module determines a current on the bit line and compares it to a reference sense current, Isense, to determine the condition of the associated memory cell. In one approach, the pre-charged capacitor in the current sensing module discharges through the bit line (via lines 510, junction 511 and line 512), through the memory cell 515 and into the source line (SL) so that the source acts as a current sink. Junction 511 represents a drain end of the NAND string and node 542 represents a source end. Another portion 513 of the bit line extends to a subsequent block.

Figure 6C:
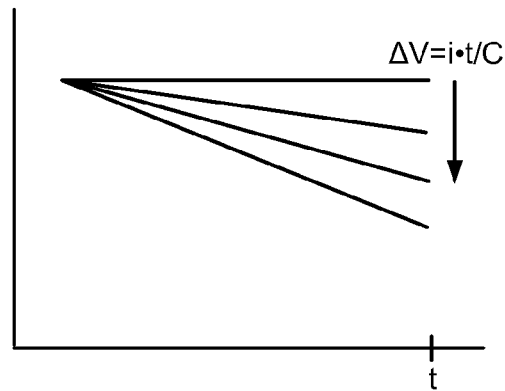
FIG. 6C depicts a voltage drop over time for different lines of fixed current, consistent with the sense operation of FIG. 6B.

In particular, if the selected storage element is in a conductive state, a relatively high current will flow. If the selected storage element is in a non-conductive state, no or relatively little current will flow. In one possible approach, the current sensing module determines a voltage drop which is tied to a fixed current flow by the relationship $\Delta V = i \cdot t / C$, where $\Delta V$ is the voltage drop, $i$ is the fixed current, $t$ is a predetermined discharge time period and $C$ is the capacitance of the pre-charged capacitor in the current sensing module. See also FIG. 6C, which depicts voltage drop with time for different lines of fixed current, consistent with the sense operation of FIG. 6B.

The greater voltage drops represent higher currents. At the end of a given discharge period, since $i$ and $C$ are fixed, $\Delta V$ for a given current can be determined. In one approach, a p-mos transistor is used to determine a level of $\Delta V$ relative to a demarcation value. In another possible approach, a cell current discriminator serves as a discriminator or comparator of current levels by determining whether the conduction current is higher or lower than a given demarcation current.

Voltage sensing, in contrast, does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

The current sensing module thus can determine whether the selected storage element is in a conductive or non-conductive state by the level of current. Generally, a higher current will flow when the selected storage element is in a conductive state and a lower current will flow when the selected storage element is in a non-conductive state. It can be concluded that a threshold voltage of the selected storage element is above or below a compare level, such as a verify level or a read level, when it is in a non-conductive state or a conductive state, respectively.

As discussed, e.g., in connection with FIGS. 7H1 and 7H2, the sense current and/or sense time can be adjusted based on the temperature and the distance between the sense component and the memory cell being sensed. For example, FIG. 7H1 shows increasing Isense levels such as Isense1, Isense_nom or Isense2. The sense current decreases at a faster rate as a function of distance for T_high than for T_low. FIG. 7H2 shows increasing sense time levels such as Time2, Time_nom and Time1. The sense time increases at a faster rate as a function of distance for T_high than for T_low.

In the example waveforms of FIG. 6B, waveform 610 depicts Vblc+Vth, waveform 611 depicts Vbl and waveform 612 depicts Vsl and Vp-well. In this example, the source line and p-well are connected so they have the same voltage. In other cases, Vsl can differ from Vp-well. At t1, Vsl and Vp-well are set at an elevated level. Vblc+Vth and Vbl increase between t1 and t2. At t2, Vblc increases and the pre-charged capacitor is discharged starting at t3. Waveform 614 depicts a voltage applied to the BLS transistor, indicating it is conductive between t0 and t7. Waveform 615 depicts a sense signal, which is a control signal indicating the time t (e.g., t5) after the capacitor starts discharging in the current sensing module. Waveforms 616 and 620 depict a sensed voltage which is tied to a fixed current for the selected bit line. A determination can be made at t5, for instance, as to whether the voltage exceeds a demarcation voltage which is tied to Isense.

It can be concluded that the selected storage element is conductive if the voltage drops below the demarcation voltage or non-conductive if the voltage does not drop below the demarcation voltage. Example demarcation voltages are shown by line 621 which represents Isense2, line 618 which represents Isense_nom and line 622 which represents Isense1. Example sense times include Time1, Time_nom and Time2. A point 617 represents the sense time=Time2 and a point 619 represents the sense time=Time1.

In another approach, instead of changing Vwl_sel, a relatively shorter sense time can be associated with a lower Vth (e.g., VvAL, VvBL or VvCL in FIG. 6A) of a target data state (e.g., A, B or C, respectively), and a relatively longer sense time can be associated with a higher Vth (e.g., VvAH, VvBH or VvCH in FIG. 6A) of a target data state (e.g., A, B or C, respectively).

Accordingly, it can be see that, in one embodiment, a method for performing a sense operation for a non-volatile storage element in a memory device comprises: determining a block in which the non-volatile storage element is located, the memory device comprises a plurality of blocks and a bit line which extends from a sense component to each of the plurality of blocks, the bit line is in communication with a drain of the non-volatile storage element; and sensing a state of the non-volatile storage element while compensating for a distance-based resistance of the bit line and a temperature-based resistance, the distance-based resistance is a function of a distance of the bit line between the sense component and the block in which the non-volatile storage element is located, and the temperature-based resistance is a function of a temperature of the memory device and the distance.

In another embodiment, a non-volatile memory device comprises: a plurality of blocks of non-volatile storage elements, each block comprising a NAND string of non-volatile storage elements, one block of the plurality of blocks comprises a selected non-volatile storage element to be sensed; a sense component; a bit line which extends from the sense component to each of the plurality of blocks, the bit line is in communication with a drain of the non-volatile storage element; and a control circuit. The control circuit performs a sense operation for the selected non-volatile storage element, the sense operation provides compensation for a distance-based resistance of the bit line and a temperature-based resistance, the distance-based resistance is a function of a distance of the bit line between the sense component and the block in which the non-volatile storage element is located, and the temperature-based resistance is a function of a temperature of the memory device and the distance.

In another embodiment, a method for performing a sense operation for a non-volatile storage element in a memory device comprises: determining a location of the non-volatile storage element in a memory array, a bit line extends from a sense component and is in communication with a drain of the non-volatile storage element; and sensing a state of the non-volatile storage element while compensating for a distance-based resistance of the bit line and a temperature-based resistance. The distance-based resistance is a function of a distance of the bit line between the sense component and the location of the non-volatile storage element, and the temperature-based resistance is a function of a temperature of the memory device. The compensation compensates a drain-to-source voltage of the non-volatile storage element based on the distance and the temperature.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing a sense operation in a memory device, comprising:

determining a block in which a non-volatile storage element is located, wherein the block is among a plurality of blocks, a bit line extends from a sense component to each of the plurality of blocks, the bit line is in communication with a drain of the non-volatile storage element, the plurality of blocks are arranged in a plurality of groups, and groups of the plurality of groups have unequal numbers of adjacent blocks from among the plurality of blocks; and sensing a state of the non-volatile storage element while compensating for a distance-based resistance and a temperature-based resistance of the bit line, the distance-based resistance is a function of a first distance of the bit line between the sense component and the block in which the non-volatile storage element is located, and the temperature-based resistance is a function of a temperature of the memory device and the first distance, wherein the compensating comprises applying a bit line voltage on the bit line, the bit line voltage has a rate of increase per degree C. of temperature which is relatively higher when the first distance is relatively greater, and the distance-based resistance and the temperature-based resistance are compensated for based on the group in which the non-volatile storage element is arranged.

a bit line which extends from the sense component to each of the plurality of blocks, the bit line is in communication with a drain of the non-volatile storage element, the bit line comprises a segment which extends in the bit line direction, and a vertical segment which is connected to the sense component and the segment which extends in the bit line direction;

a selected word line connected to a control gate of the selected non-volatile storage element; and a control circuit, the control circuit is configured to perform a sense operation for the selected non-volatile storage element, the sense operation provides compensation for a distance-based resistance and a temperature-based resistance of the bit line, the distance-based resistance is a function of a first distance of the bit line between the sense component and the block in which the non-volatile storage element is located, and the temperature-based resistance is a function of a temperature of the memory device and the first distance, wherein the control circuit, to provide the compensation, is configured to apply a control gate voltage to the control gate of the non-volatile storage element during the sense operation, the control gate voltage has a rate of decrease per degree C. of temperature which is relatively higher when the first distance is relatively smaller, and the first distance comprises a distance of the vertical segment and a distance of the segment which extends in the bit line direction.

2. The method of claim 1, wherein:
the applying the bit line voltage comprises providing a control signal to one adjustable resistor to provide a resistance which is a function of the first distance and providing a control signal to another adjustable resistor to provide a resistance which is a function of the first distance and of the temperature; and
the one adjustable resistor is in series with the another adjustable resistor in a circuit which applies a voltage to a clamping transistor; and
the clamping transistor clamps the bit line voltage.

3. The method of claim 2, wherein:
an additional resistor is in series with the one adjustable resistor and the another adjustable resistor in the circuit; and
the additional resistor has a reference resistance which is not based on the temperature and is not based on the first distance.

4. The method of claim 3, wherein:
the reference resistance is appropriate for a reference condition comprising a reference location of one block of the plurality of blocks and a reference temperature; and
the one adjustable resistor and the another adjustable resistor have a resistance of zero when the block in which the non-volatile storage element is located is the one block and the temperature of the memory device is the reference temperature.

5. The method of claim 1, wherein:
a number of blocks in each group of the plurality of groups becomes progressively smaller moving away from or toward the sense component.

6. The method of claim 1, wherein:
the plurality of blocks are arranged on a substrate in a bit line direction of the memory device;
each block of the plurality of blocks comprises a multi-layer stack in which vertical columns of memory cells are arranged;
the bit line comprises a vertical segment and a segment which extends in the bit line direction; and
the first distance comprises a distance of the vertical segment and a distance of the segment which extends in the bit line direction.

7. The method of claim 6, wherein:
the sense component is on the substrate; and
the vertical segment is connected to the sense component and the segment which extends in the bit line direction.

8. The method of claim 7, wherein:
the non-volatile storage element is in a NAND string;
the bit line comprises a vertical portion between the bit line and a drain end of the NAND string; and
the first distance comprises a distance of the vertical portion.

* * * * *